(12) United States Patent
Kawaguchi

(10) Patent No.: US 9,981,618 B2
(45) Date of Patent: May 29, 2018

(54) ELECTRICAL JUNCTION BOX

(71) Applicant: Sumitomo Wiring Systems, Ltd., Yokkaichi, Mie (JP)

(72) Inventor: Kiyofumi Kawaguchi, Mie (JP)

(73) Assignee: Sumitomo Wiring Systems, Ltd., Yokkaichi-shi, Mie (JP)

( * ) Notice: Subject to any disclaimer, the term of this patent is extended or adjusted under 35 U.S.C. 154(b) by 0 days. days.

(21) Appl. No.: 15/690,998

(22) Filed: Aug. 30, 2017

(65) Prior Publication Data

US 2018/0065576 A1   Mar. 8, 2018

(30) Foreign Application Priority Data

Sep. 6, 2016 (JP) ................................ 2016-174008

(51) Int. Cl.

| | |
|---|---|
| *B60R 16/023* | (2006.01) |
| *H02G 1/14* | (2006.01) |
| *H02G 3/16* | (2006.01) |
| *H05K 7/06* | (2006.01) |
| *H02G 3/08* | (2006.01) |
| *H01R 13/518* | (2006.01) |
| *H01H 85/20* | (2006.01) |
| *H01R 9/24* | (2006.01) |

(52) U.S. Cl.
CPC ....... *B60R 16/0238* (2013.01); *H01R 13/518* (2013.01); *H02G 1/14* (2013.01); *H02G 3/081* (2013.01); *H02G 3/088* (2013.01); *H02G 3/16* (2013.01); *H05K 7/06* (2013.01); *H01H 2085/208* (2013.01); *H01R 9/2458* (2013.01)

(58) Field of Classification Search
CPC ...... B60R 16/0238; H02G 1/14; H02G 3/081; H02G 3/088; H02G 3/16; H05K 7/06; H01R 13/518; H01R 9/2458; H01H 2085/208
USPC .................................... 439/76.2, 620.27, 949
See application file for complete search history.

(56) References Cited

U.S. PATENT DOCUMENTS 9,686,877 B2 *   6/2017  Tokumasu ........... H05K 5/0221
2003/0219998 A1 * 11/2003  Kakuta .............. H01R 13/5227
439/76.2

(Continued)

FOREIGN PATENT DOCUMENTS

JP       H11-004518 A     1/1999
JP       2015-053787 A    3/2015

*Primary Examiner* — Tulsidas C Patel
*Assistant Examiner* — Travis Chambers
(74) *Attorney, Agent, or Firm* — Dinsmore & Shohl LLP

(57) ABSTRACT

Provided is an electrical junction box configured promptly release the electrical junction box from a state where water has intruded therein, thereby preventing the occurrence of a vehicle fire due to submersion. An internal circuit includes a high-voltage circuit bus bar and a low-voltage circuit bus bar having a lower potential than the high-voltage circuit bus bar, and a lower case includes a bottom wall and a peripheral wall protruding from a peripheral edge portion of the bottom wall toward an upper case. A high-voltage circuit region where the high-voltage circuit bus bar is disposed, a low-voltage circuit region where the low-voltage circuit bus bar is disposed, and a dividing wall divides these regions are provided inside the peripheral wall, and a height dimension of the dividing wall from the bottom wall is configured to be greater than a height dimension of the peripheral wall from the bottom wall.

4 Claims, 5 Drawing Sheets

(56) References Cited

U.S. PATENT DOCUMENTS

| 2008/0149387 A1* | 6/2008 | Oda | H05K 7/026 |
| | | | 174/520 |
| 2012/0064741 A1* | 3/2012 | Kawaguchi | H01R 9/226 |
| | | | 439/76.2 |
| 2014/0322934 A1* | 10/2014 | Kowtun | B60R 16/0238 |
| | | | 439/76.2 |

* cited by examiner

ELECTRICAL JUNCTION BOX

CROSS-REFERENCE TO RELATED APPLICATIONS

This application claims priority of Japanese Patent Application No. JP 2016-174008 filed Sep. 6, 2016.

TECHNICAL FIELD

The present invention relates to an electrical junction box that is mounted on a vehicle such as an automobile, and particularly relates to an electrical junction box including a structure for preventing ignition after submersion.

BACKGROUND

Conventionally, electrical junction boxes such as a relay box or a junction box have been used in automobile electric/electronic systems, and power is efficiently distributed from a battery via the electrical junction box to vehicle-mounted electric and electronic components and the like. In particular, vehicles using a higher voltage and a larger current, such as an electric car, have been on the rise in recent years. For example, as described in JP 2015-53787A, an electrical junction box including, in addition to a low-voltage bus bar constituting a low-voltage circuit, a high-voltage bus bar constituting a high-voltage circuit has also come into use.

When water enters such an electrical junction box, there is the possibility that a leak or the like will occur between the bus bars. For this reason, the electrical junction box undergoes a certain level of waterproofing in view of water splashes that are expected to occur during normal use of a vehicle. For example, as described in JP H11-004518A, an electrical junction box in which a gap in a case has been sealed with a sealing member or the like is known.

Naturally, using an electrical junction box including such a conventional waterproof structure can prevent the intrusion of water into the electrical junction box during normal use of a vehicle. However, it is impossible to prevent the intrusion of water due to a tsunami, a flood, or the like in an unexpected situation. In particular, the problem of a vehicle fire occurring after the water recedes after a vehicle was submerged due to a tsunami, a flood, or the like has been pointed out in recent years. The problem pointed out is that when electrical conduction occurs again when water recedes from a vehicle that was submerged, short circuiting occurs between adjacent bus bars via a short circuit path formed by water or a deposited metal, and the heat generated at that time overheats the surrounding resin and the like and starts a fire.

However, the waterproof structures of the conventional electrical junction boxes as described above cannot achieve any effective function to prevent the occurrence of such a vehicle fire, and instead tend to cause the accumulation of water that has entered the electrical junction boxes, thus possibly increasing the risk of a vehicle fire.

SUMMARY

The present invention has been made in light of the above-described circumstances, and a problem to be solved by the invention is to provide an electrical junction box having a novel structure that can promptly release the electrical junction box from a state in which water has intruded therein, thereby preventing the occurrence of a vehicle fire due to submersion.

A first aspect of the present invention is directed to an electrical junction box including: a case; and an internal circuit housed in the case, the case including a lower case configured to be located at a lower position and an upper case configured to be located at an upper position when mounted on a vehicle, wherein the internal circuit includes a high-voltage circuit bus bar and a low-voltage circuit bus bar having a lower potential than the high-voltage circuit bus bar, the lower case includes a bottom wall and a peripheral wall provided so as to protrude from a peripheral edge portion of the bottom wall toward the upper case, and a high-voltage circuit region in which the high-voltage circuit bus bar is disposed, a low-voltage circuit region in which the low-voltage circuit bus bar is disposed, and a dividing wall that divides the high-voltage circuit region and the low-voltage circuit region are provided inside the peripheral wall, and a height dimension of the dividing wall from the bottom wall is configured to be greater than a height dimension of the peripheral wall from the bottom wall.

According to this aspect, the high-voltage circuit region in which the high-voltage circuit bus bar is disposed, the low-voltage circuit region in which the low-voltage circuit bus bar is disposed, and the dividing wall that divides these regions are provided inside the peripheral wall of the lower case configured to be located at a lower position when mounted on the vehicle, and the height dimension of the dividing wall from the bottom wall is configured to be greater than the height dimension of the peripheral wall from the bottom wall. Consequently, even if the vehicle is submerged owing to a tsunami, a flood, or the like, bodies of water containing electrolytes such as those in salt water remaining in the high-voltage circuit region and the low-voltage circuit region inside the peripheral wall are kept in an electrically insulated state due to being kept apart by the dividing wall after water has receded. That is, even if there is some water remaining in each of the high-voltage circuit region and the low-voltage circuit region, the water level is at about the height of the peripheral wall at maximum, and the dividing wall that divides these regions is configured to be higher, so that it is possible to prevent the risk of a short circuit between the two circuit regions via water.

This also makes it possible to reliably prevent the conventional problem, for example, that a state where a plurality of bus bars having a potential difference are submerged in undrained water that cannot go over the peripheral wall is maintained, in which electrolysis proceeds even after water has receded, and an increased amount of a metal such as cuprous oxide is deposited and forms a short circuit path connecting the bus bars.

Note that a high-voltage circuit bus bar and a low-voltage circuit bus bar refer to those having a potential difference therebetween. The high-voltage circuit bus bar includes, for example, a high-voltage circuit bus bar that is connected directly, or indirectly via another member, to the positive terminal of a high-voltage battery, and the low-voltage circuit bus bar includes, for example, a low-voltage circuit bus bar that is connected directly, or indirectly via another member, to the positive terminal or the negative terminal of a low-voltage battery.

A second aspect of the present invention is directed to the electrical junction box according to the first aspect, wherein opposite end portions of the dividing wall are coupled to the peripheral wall of the lower case.

According to this aspect, the opposite end portions of the dividing wall are coupled to the peripheral wall of the lower case, and thereby, one of the high-voltage circuit region and the low-voltage circuit region can be completely isolated from the other in a closed region formed by the peripheral wall and the dividing wall. Therefore, even if there is some water remaining inside the electrical junction box after submersion, it is possible to more reliably prevent the occurrence of a short circuit via the remaining water or electrolysis via water, thus more advantageously preventing the occurrence of a vehicle fire.

A third aspect of the present invention is directed to the electrical junction box according to the first or second aspect, wherein the dividing wall has a corner portion where an extension direction of the dividing wall is changed, and a drain hole extending through the bottom wall of the lower case is provided in proximity to the corner portion.

According to this aspect, the drain hole is provided in proximity to the corner portion, where water is expected to be likely to accumulate, of the dividing wall on the bottom wall of the lower case, so that it is possible to even more promptly facilitate the draining of water from the inside of the electrical junction box.

According to the present invention, the high-voltage circuit region in which the high-voltage circuit bus bar is disposed, the low-voltage circuit region in which the low-voltage circuit bus bar is disposed, and the dividing wall that divides these regions are provided inside the peripheral wall of the lower case configured to be located at a lower position when mounted on a vehicle, and the height dimension of the dividing wall is configured to be greater than the height dimension of the peripheral wall. Consequently, even if the vehicle is submerged owing to a tsunami, a flood, or the like, bodies of water containing electrolytes such as those in salt water remaining in the high-voltage circuit region and the low-voltage circuit are kept in an electrically insulated state by the dividing wall after the water has receded, and thus it is possible to prevent the risk of a short circuit between the two circuit regions via water. Therefore, it is also possible to reliably prevent the conventional problem, for example, that electrolysis proceeds even after the water has receded, and an increased amount of a metal such as cuprous oxide is deposited and forms a short circuit path connecting the bus bars.

BRIEF DESCRIPTION OF THE DRAWINGS

FIG. 2 is an exploded perspective view of the electrical junction box of the present embodiment as viewed from a direction (the back) opposite to the direction from which FIG. 1 is viewed;

DETAILED DESCRIPTION OF PREFERRED EMBODIMENTS

Figure 1:
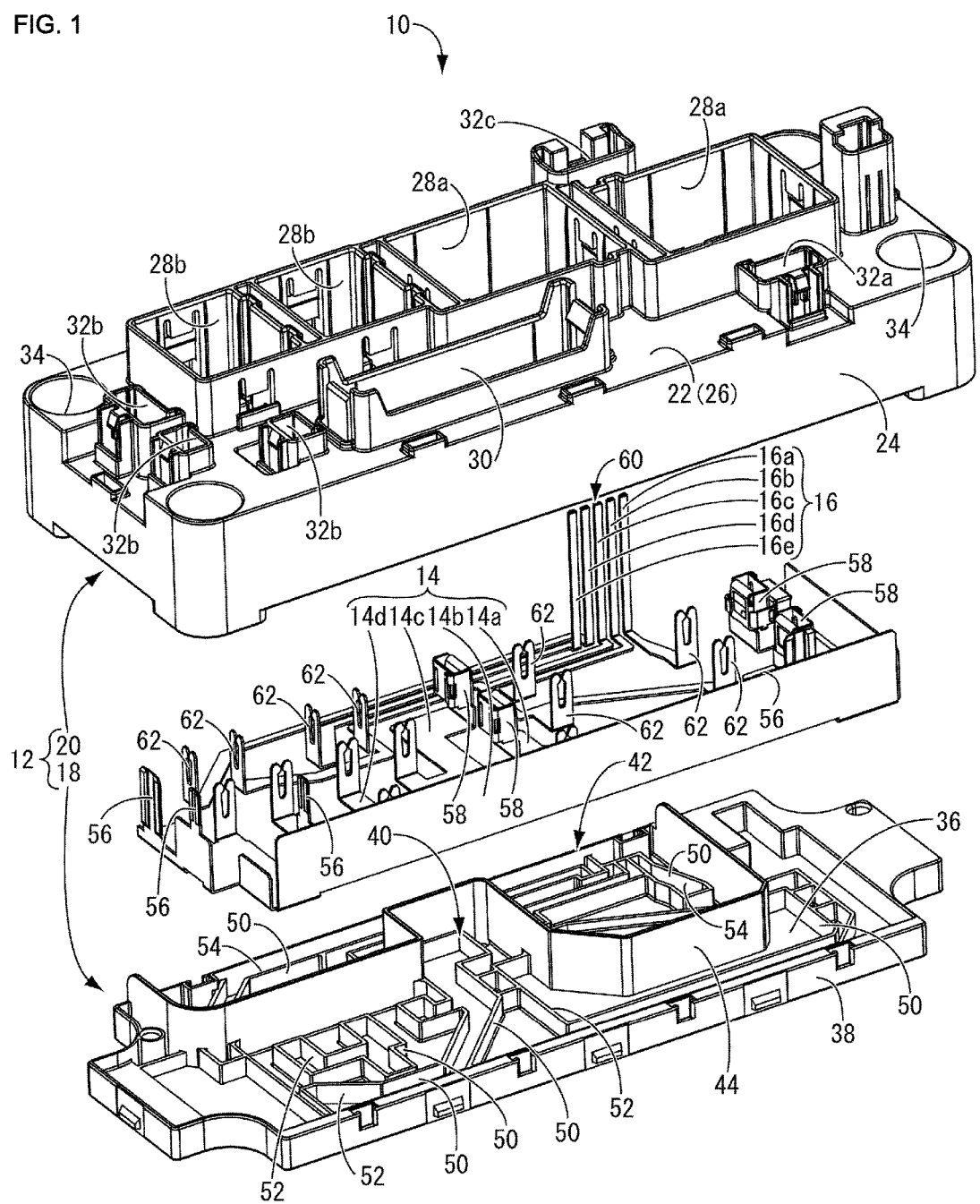
FIG. 1 is an exploded perspective view showing an electrical junction box according to an embodiment of the present invention.

Hereinafter, an embodiment of the present invention will be described with reference to the drawings.

FIGS. 1 to 6 show an electrical junction box 10 according to an embodiment of the present invention. The electrical junction box 10 has a configuration in which high-voltage circuit bus bars 14 and low-voltage circuit bus bars 16 having a lower potential than the high-voltage circuit bus bars 14 are housed inside a case 12. The high-voltage circuit bus bars 14 and the low-voltage circuit bus bars 16 constitute an internal circuit. More specifically, the case 12 includes a lower case 18 configured to be located at a lower position and an upper case 20 configured to be located at an upper position when mounted on a vehicle, and each of the lower case 18 and the upper case 20 is integrally formed through injection molding or the like using, for example, a synthetic resin such as polypropylene (PP) or polyamide (PA). Note that in the following description, "upward" refers to the upward direction in FIGS. 1 to 2, and "downward" refers to the downward direction in FIGS. 1 to 2. In addition, "forward" refers to the left in FIGS. 4 to 5, and "rearward" refers to the right in FIGS. 4 to 5. Further, "length direction" refers to a lateral direction in FIGS. 4 to 5, and "width direction" refers to a vertical direction in FIGS. 4 to 5.

Figure 2:
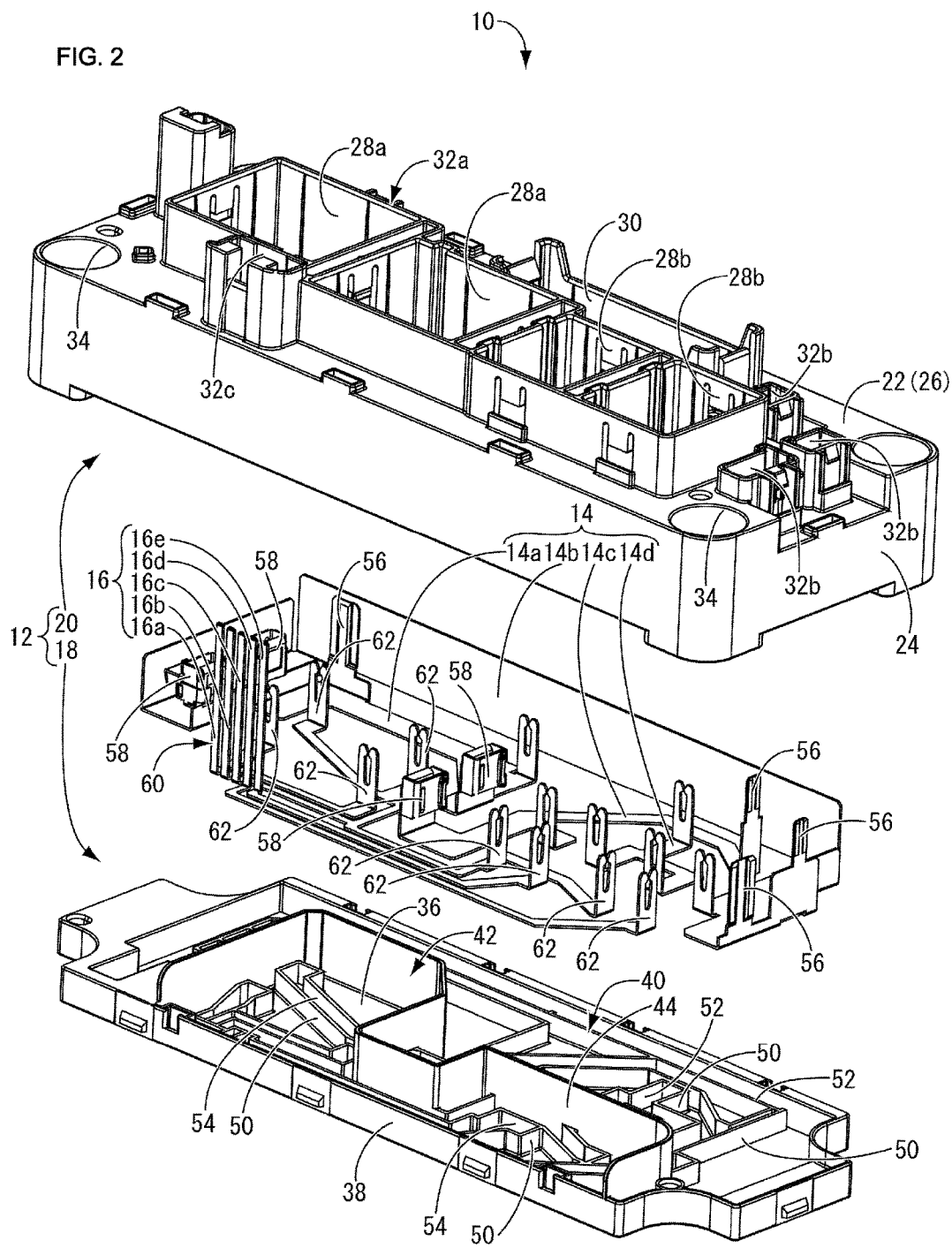
Figure 3:
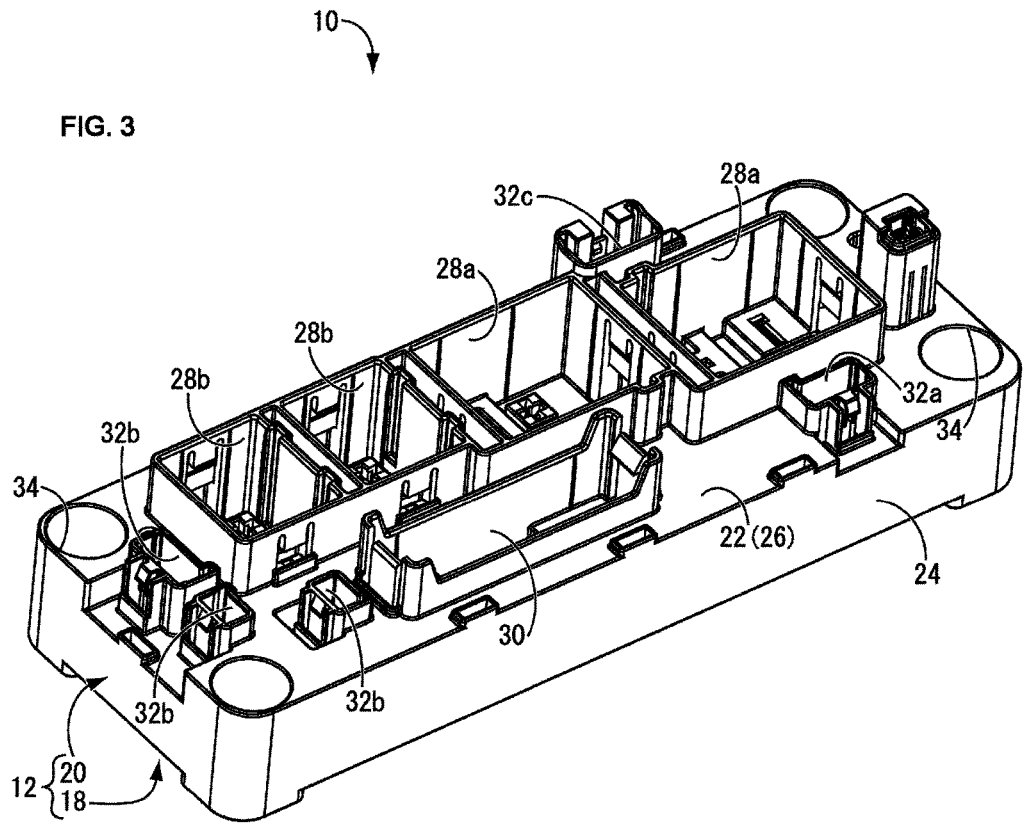
FIG. 3 is a perspective view of the electrical junction box shown in FIG. 1 in an assembled state.
Figure 4:
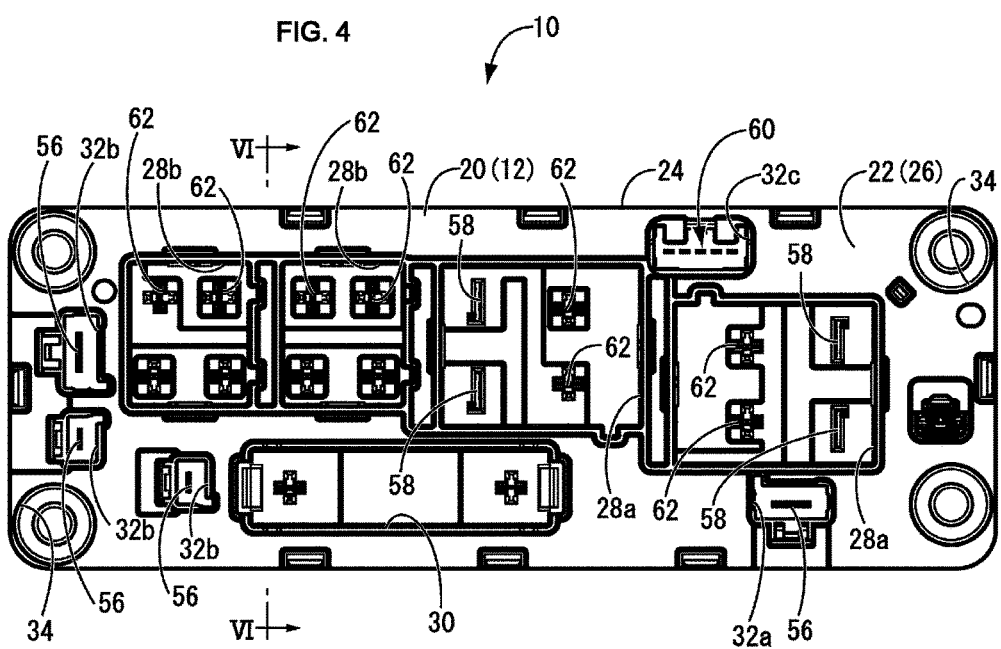
FIG. 4 is a plan view of FIG. 3.

As shown in FIGS. 1 to 2, the upper case 20 has a downwardly open, substantially box-like shape in which a downwardly protruding peripheral wall 24 is formed at an outer peripheral edge portion of an upper wall 22 having a substantially horizontally elongated rectangular plate shape. Various relay mounting portions 28a and 28b, a resistor mounting portion 30, and various connector mounting portions 32a, 32b, and 32c are formed so as to protrude from an upper surface 26 of the upper wall 22 of the upper case 20 so as to allow various relays and resistors and various connectors (not shown) to be mounted thereto. Bolt insertion holes 34 through which bolts for fixing the electrical junction box 10 according to the present invention to a predetermined location of a vehicle (not shown), for example, are formed in four corners of the upper wall 22 of the upper case 20 so as to vertically extend therethrough.

Figure 5:
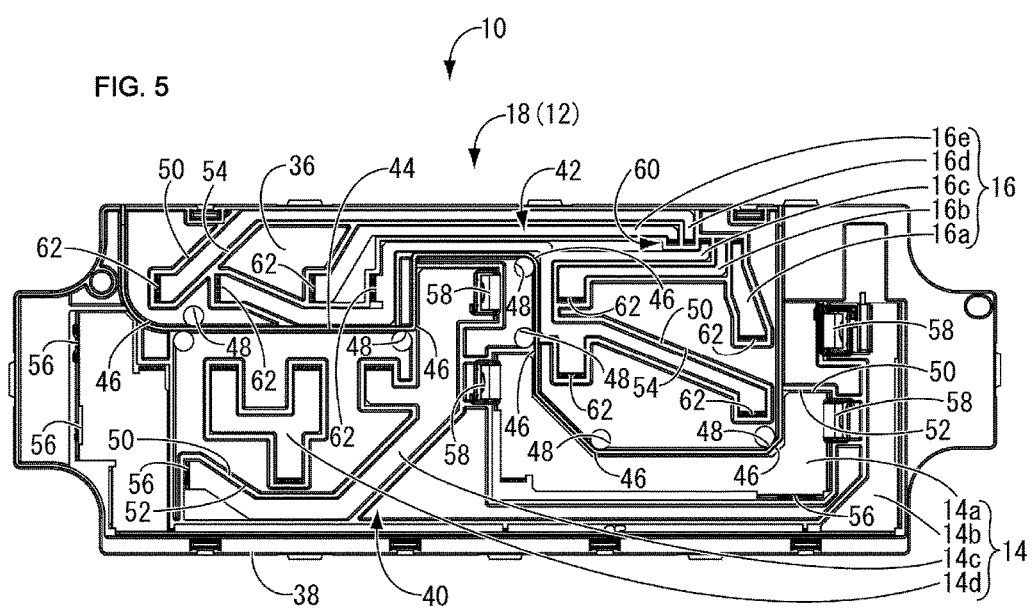
FIG. 5 is a plan view showing a state where bus bars are disposed in the lower case shown in FIG. 1.
Figure 6:
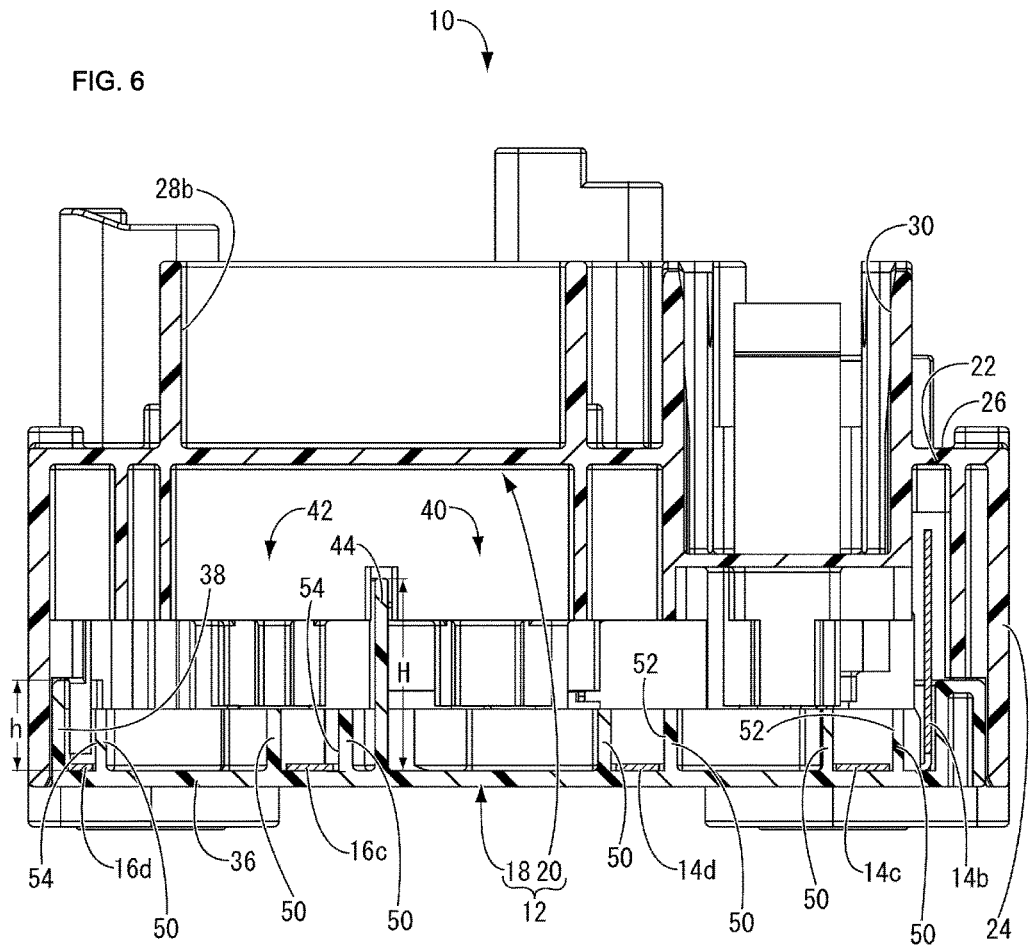
FIG. 6 is an enlarged cross-sectional view taken along the line VI-VI in FIG. 4.

On the other hand, as shown in FIGS. 1 to 2, the lower case 18 has a substantially box-like shape that opens upwardly as a whole, the box-like shape including a substantially horizontally elongated, rectangular flat plate-shaped bottom wall 36 having substantially the same shape as the upper wall 22 of the upper case 20 in plan view, and a peripheral wall 38 formed at an outer peripheral edge portion of the bottom wall 36 so as to protrude upward, or in other words, toward the upper case 20. The four corners of the bottom wall 36 of the lower case 18 are each formed by being cut out in a substantially quadrant shape in plan view so as to allow the insertion of a bolt for fixing the electrical junction box 10 according to the present invention. Furthermore, on the bottom wall 36 inside the peripheral wall 38, a high-voltage circuit region 40 in which the high-voltage circuit bus bars 14 are disposed is provided on the front side (the lower side in FIG. 5), which is one side in the width direction, and a low-voltage circuit region 42 in which the low-voltage circuit bus bars 16 are disposed is provided on the back side (the upper side in FIG. 5), which is the other side in the width direction. Between the high-voltage circuit region 40 and the low-voltage circuit region 42, a substantially flat plate-shaped dividing wall 44 that divides these regions is formed so as to protrude upward from the bottom wall 36. In addition, as shown in FIG. 6, the height dimension: H of the dividing wall 44 from the surface of the bottom wall 36 is configured to be greater than the height dimension: h of the peripheral wall 38 from the surface of the bottom wall 36 (H is preferably at least 1.2 times greater than, more preferably at least 1.5 times greater than, further preferably at least 2 times greater than h). As can be clearly seen from FIG. 2 or 5, opposite end portions of the dividing wall 44 are coupled to the peripheral wall 38 of the lower case 18. Further, as shown in FIG. 5, the dividing wall 44 has corner portions 46 where its extension direction is changed by the dividing wall 44 alone or by a combination of the dividing wall 44 and partitions 50, which will be described later, and a drain hole 48 extending through the bottom wall 36 of the lower case 18 is provided in proximity to each of the corner portions 46. Note that each of the high-voltage circuit bus bars 14 and the low-voltage circuit bus bars 16 is formed through press punching and bending or the like of a metal plate made of copper, a copper alloy, or the like, and can be set to any shape taking the circuit routing configuration or the like into consideration.

More specifically, as shown in FIGS. 1 to 2, many partitions 50 having a substantially flat plate shape are provided in the high-voltage circuit region 40 and the low-voltage circuit region 42 so as to protrude upward from the bottom wall 36, and the regions surrounded by the partitions 50 form high-voltage circuit bus bar housing portions 52 in which the high-voltage circuit bus bars 14 are housed and disposed, and low-voltage circuit bus bar housing portions 54 in which the low-voltage circuit bus bars 16 are housed and disposed. Here, as shown in FIGS. 1, 2, and 5, the high-voltage circuit bus bars 14 include a high-voltage circuit bus bar 14a that is electrically connected to the positive terminal of a high-voltage battery (not shown), for example, by connecting a connector (not shown) mounted to a connector mounting portion 32a to a tab-shaped connector connection terminal 56 disposed at the connector mounting portion 32a. The high-voltage circuit bus bar 14a is substantially U-shaped in plan view (see FIG. 5), with the connector connection terminal 56 being provided on the rear end side (the right side in FIG. 5) so as to protrude upward, and female relay output connection terminals 58 being provided on the rear end side and the front end side so as to protrude upward. Then, relay output terminals (not shown) are connected to the relay output connection terminals 58 respectively disposed at the two relay mounting portions 28a, and thereby, the high-voltage circuit bus bars 14b and 14c are electrically to the high-voltage circuit bus bar 14a so as to be electrically connected to the positive terminal of the high-voltage battery. Furthermore, the remaining high-voltage circuit bus bar 14d is also connected to the high-voltage circuit bus bars 14b and 14c via the relay mounting portions 28b, and is thus electrically connected to the positive terminal of the high-voltage battery. As is clear from the foregoing, the high-voltage circuit bus bars 14a, 14b, 14c, and 14d disposed in the high-voltage circuit region 40 can all be electrically connected to the positive terminal of the high-voltage battery. In addition, a connector connection terminal 56 that electrically connects the opposing connector terminal (not shown) to the positive terminal of the high-voltage battery by being disposed at the connector mounting portion 32b is provided on the front end side (the left side in FIG. 5) of each of the high-voltage circuit bus bars 14b and 14c so as to protrude upward.

On the other hand, the low-voltage circuit bus bars 16 disposed in the low-voltage circuit region 42 include five low-voltage circuit bus bars 16a to 16e each including a rod-shaped connector connection terminal 60 provided at one end portion so as to protrude upward. A predetermined voltage is supplied to each of the five low-voltage circuit bus bars 16a to 16e by disposing the connector connection terminal 60 provided on one end portion at a connector mounting portion 32c, and assembling the opposing connector (not shown) to the connector mounting portion 32c. The predetermined voltage is supplied via tuning fork-shaped relay input connection terminals 62 provided at the other end portions of the five low-voltage circuit bus bars 16a to 16e to relay input terminals (not shown) that are mounted to the relay mounting portions 28a and 28b. More specifically, the four low-voltage circuit bus bars 16a, 16b, 16d, and 16e are configured to be connected to the positive terminals of the relay input terminals (not shown) that are mounted to the relay mounting portions 28a and 28b, and a ground voltage corresponding to a positive voltage or a negative voltage of a low-voltage battery (not shown), or an intermediate voltage therebetween is supplied to the four low-voltage circuit bus bars 16a, 16b, 16d, and 16e. On the other hand, the low-voltage circuit bus bar 16c is configured to be connected to the negative terminals of all of the relay input terminals (not shown) that are mounted to the relay mounting portions 28a and 28b via a tuning fork-shaped relay input connection terminal 62 provided at the other end portion of the low-voltage circuit bus bar 16c. That is, a ground voltage corresponding to a negative voltage of the low-voltage battery (not shown) is supplied to the low-voltage circuit bus bar 16c.

With the electrical junction box 10 having such a structure, on the bottom wall 36 inside the peripheral wall 38 of the lower case 18 configured to be located at a lower position when mounted on the vehicle, the high-voltage circuit region 40 in which the high-voltage circuit bus bars 14 are disposed is provided on one side in the width direction, and the low-voltage circuit region 42 in which the low-voltage circuit bus bars 16 are disposed is provided on the other side in the width direction. Then, the dividing wall 44 that divides the high-voltage circuit region 40 and the low-voltage circuit region 42 is provided between these regions so as to protrude upward from the bottom wall 36, and the height dimension: H of the dividing wall 44 from the surface of the bottom wall 36 is configured to be greater than the height dimension: h of the peripheral wall 38 from the surface of the bottom wall 36. Therefore, even if the vehicle is submerged owing to a tsunami, a flood, or the like, bodies of water containing electrolytes such as those in salt water remaining in the high-voltage circuit region 40 and the low-voltage circuit region 42 inside the peripheral wall 38 of the lower case 18 are kept apart by the dividing wall 44 after the water has receded, and are kept in an electrically insulated state. Accordingly, even if there is some water remaining in the high-voltage circuit region 40 and the low-voltage circuit region 42, it is possible to prevent, with the dividing wall 44, short circuiting via water between the high-voltage circuit bus bars 14 and the low-voltage circuit bus bars 16 that are disposed in their respective regions. This makes it possible to reliably prevent the conventional problem, for example, that electrolysis proceeds between the high-voltage circuit bus bars 14 and the low-voltage circuit bus bars 16 even after the water has receded, and an increased amount of a metal such as cuprous oxide is deposited and forms a short circuit path connecting the bus bars 14 and 16.

Since the opposite end portions of the dividing wall 44 are coupled to the peripheral wall 38 of the lower case 18, each of the high-voltage circuit region 40 and the low-voltage circuit region 42 can be completely isolated in a closed region defined by the peripheral wall 38 and the dividing wall 44. Accordingly, even if there is some water remaining in the high-voltage circuit region 40 and the low-voltage circuit region 42 after the water has receded, it is possible to more reliably prevent the occurrence of a short circuit or electrolysis via the remaining water, making it possible to more advantageously prevent the occurrence of a vehicle fire. Further, since the drain holes 48 are provided in proximity to the corner portions 46, where water is expected to be likely to accumulate, of the dividing wall 44, it is possible to even more promptly facilitate the draining of water from the inside of the electrical junction box 10.

Although an embodiment of the present invention has been described above in detail, the invention is not intended to be limited by the specific description thereof. For example, although the opposite end portions of the dividing wall 44 are coupled to the peripheral wall 38 of the lower case 18 in the above embodiment, the opposite end portions of the dividing wall 44 may be coupled to each other. In this case as well, each of the high-voltage circuit region 40 and the low-voltage circuit region 42 can be completely isolated in a closed region defined either by the dividing wall 44, or by the peripheral wall 38 and the dividing wall 44. Therefore, as in the present embodiment, even if there is some water remaining in the high-voltage circuit region 40 and the low-voltage circuit region 42 after the water has receded, it is possible to more reliably prevent the occurrence of a short circuit or electrolysis via the remaining water, thus making it possible to more advantageously prevent the occurrence of a vehicle fire. In the above embodiment, the high-voltage circuit bus bars 14 are all electrically connected to the positive terminal of the high-voltage battery, and a ground voltage corresponding to a positive voltage or a negative voltage of a low-voltage battery (not shown), or an intermediate voltage therebetween is supplied to the low-voltage circuit bus bars 16. However, the high-voltage circuit bus bars 14 and the low-voltage circuit bus bars 16 may be any bus bars having a potential difference therebetween. For example, the high-voltage circuit bus bars 14 may include a high-voltage circuit bus bar that is connected directly, or indirectly via another member, to the positive terminal of the high-voltage battery, and the low-voltage circuit bus bars 16 may include, for example, a high-voltage circuit bus bar that is connected directly, or indirectly via another member, to the positive terminal or the negative terminal of the low-voltage battery. In addition, in the above embodiment, the drain holes 48 extending through the bottom wall 36 of the lower case 18 are provided in proximity to the corner portions 46 where the extension direction of the dividing wall 44 is changed. However, any number of the drain holes 48 may be provided at any positions of the bottom wall 36 of the lower case 18, or no drain hole 48 may be provided.

What is claimed is:

1. An electrical junction box comprising:
a case; and an internal circuit housed in the case,
the case including a lower case configured to be located at a lower position and an upper case configured to be located at an upper position when mounted on a vehicle, wherein
the internal circuit includes a high-voltage circuit bus bar and a low-voltage circuit bus bar having a lower potential than the high-voltage circuit bus bar,
the lower case includes a bottom wall and a peripheral wall provided so as to protrude from a peripheral edge portion of the bottom wall toward the upper case, and a high-voltage circuit region in which the high-voltage circuit bus bar is disposed, a low-voltage circuit region in which the low-voltage circuit bus bar is disposed, and a dividing wall that divides the high-voltage circuit region and the low-voltage circuit region are provided inside the peripheral wall, and
a height dimension of the dividing wall from the bottom wall is configured to be greater than a height dimension of the peripheral wall from the bottom wall.

2. The electrical junction box according to claim 1, wherein
the dividing wall has a corner portion where an extension direction of the dividing wall is changed, and a drain hole extending through the bottom wall of the lower case is provided in proximity to the corner portion.

3. The electrical junction box according to claim 1, wherein
opposite end portions of the dividing wall are coupled to the peripheral wall of the lower case.

4. The electrical junction box according to claim 3, wherein the dividing wall has a corner portion where an extension direction of the dividing wall is changed, and a drain hole extending through the bottom wall of the lower case is provided in proximity to the corner portion.

* * * * *